United States Patent [19]

Sibley

[11] Patent Number: 4,485,435
[45] Date of Patent: Nov. 27, 1984

[54] MEMORY MANAGEMENT METHOD AND APPARATUS FOR INITIALIZING AND/OR CLEARING R/W STORAGE AREAS

[75] Inventor: Henry C. Sibley, Adams Basin, N.Y.

[73] Assignee: General Signal Corporation, Stamford, Conn.

[21] Appl. No.: 241,819

[22] Filed: Mar. 9, 1981

[51] Int. Cl.³ .............................................. G06F 11/00
[52] U.S. Cl. .................................................... 364/200
[58] Field of Search ... 364/200 MS File, 900 MS File

[56] References Cited

U.S. PATENT DOCUMENTS

| | | | |
|---|---|---|---|
| 3,351,917 | 11/1967 | Shimabukuro | 364/900 |
| 3,654,448 | 4/1972 | Hitt | 364/200 |
| 4,112,502 | 9/1978 | Scheuneman | 364/900 |
| 4,138,732 | 2/1979 | Suzuki et al. | 364/900 |
| 4,142,243 | 2/1979 | Bishop et al. | 364/900 |
| 4,149,244 | 4/1979 | Anderson et al. | 364/200 |
| 4,151,593 | 4/1979 | Jenkins et al. | 364/200 |
| 4,167,782 | 9/1979 | Joyce et al. | 364/200 |
| 4,184,201 | 1/1980 | Melberg et al. | 364/200 |
| 4,195,341 | 3/1980 | Joyce et al. | 364/200 |
| 4,195,343 | 3/1980 | Joyce | 364/200 |
| 4,251,863 | 2/1981 | Rothenberger | 364/200 |
| 4,270,168 | 5/1981 | Murphy et al. | 364/200 |
| 4,334,307 | 6/1982 | Bourgeois et al. | 371/16 |
| 4,355,390 | 10/1982 | Hellwig et al. | 371/21 |
| 4,358,849 | 11/1982 | Sery | 371/53 |
| 4,368,532 | 1/1983 | Imazeki et al. | 371/21 |

Primary Examiner—Gareth D. Shaw
Assistant Examiner—Daniel K. Dorsey
Attorney, Agent, or Firm—Pollock, Vande Sande & Priddy

[57] ABSTRACT

Apparatus and method for vital memory management of data. Method and apparatus is disclosed for clearing memory on specified conditions and for assuring the clearing is effected. Both random access and stack operation are implemented. Furthermore, an intentional delay may be provided to ensure that data using apparatus properly interprets the signals provided thereto. Included is a word testing method and apparatus which is also arranged to be self-checking.

13 Claims, 10 Drawing Figures

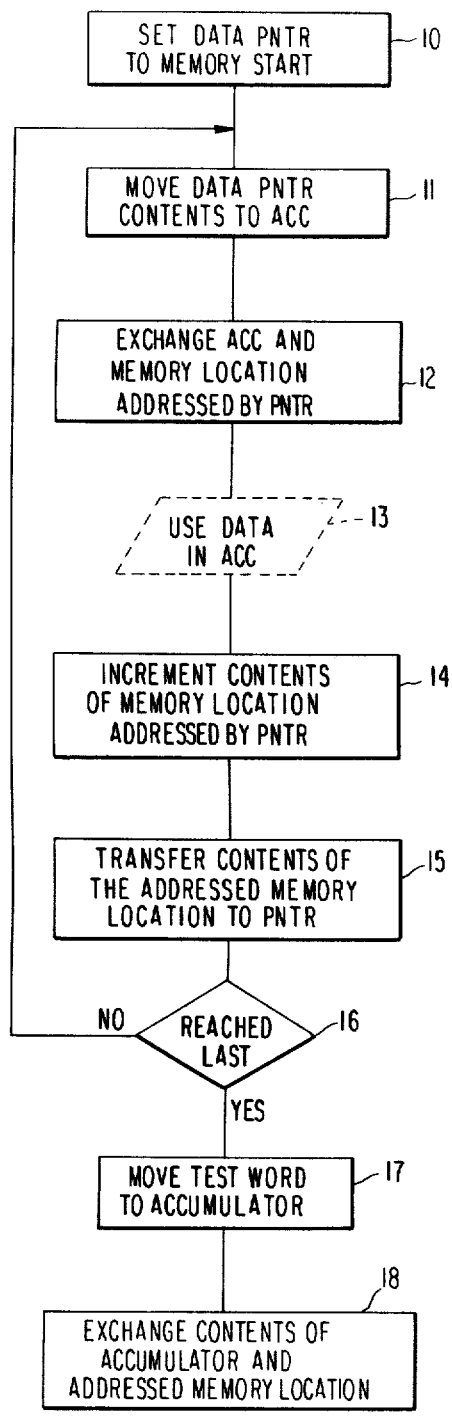
FIG 1 READ VITAL MEMORY
USES PNTR, REQUIRES MEMORY START ADDRESS, LAST ADDRESS, TEST WORD
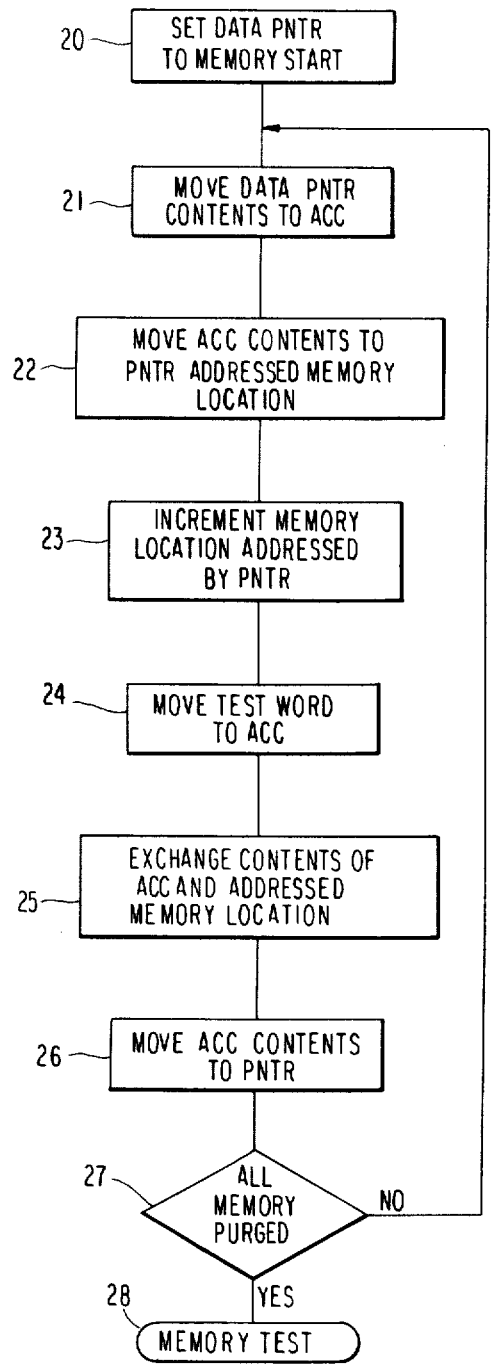
FIG 2 PURGE VITAL MEMORY
USES PNTR, REQUIRES MEMORY START, TEST WORD, MEMORY TEST SUB

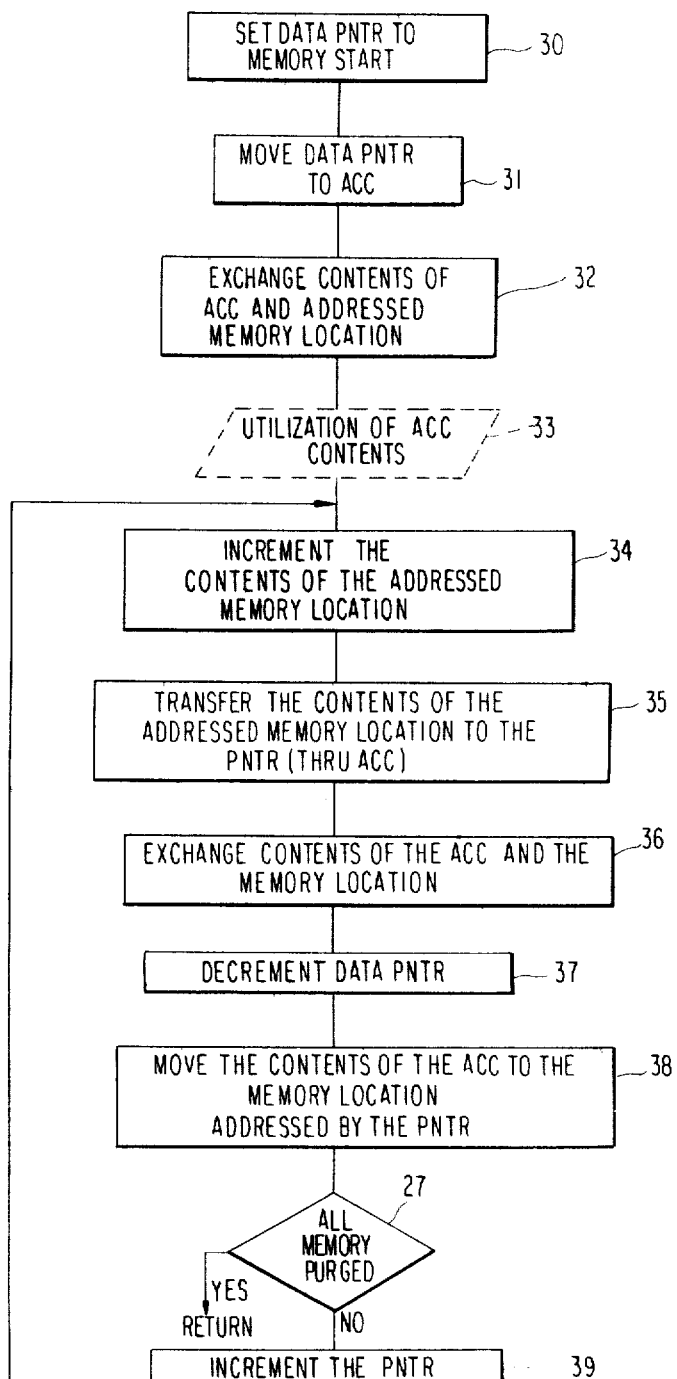

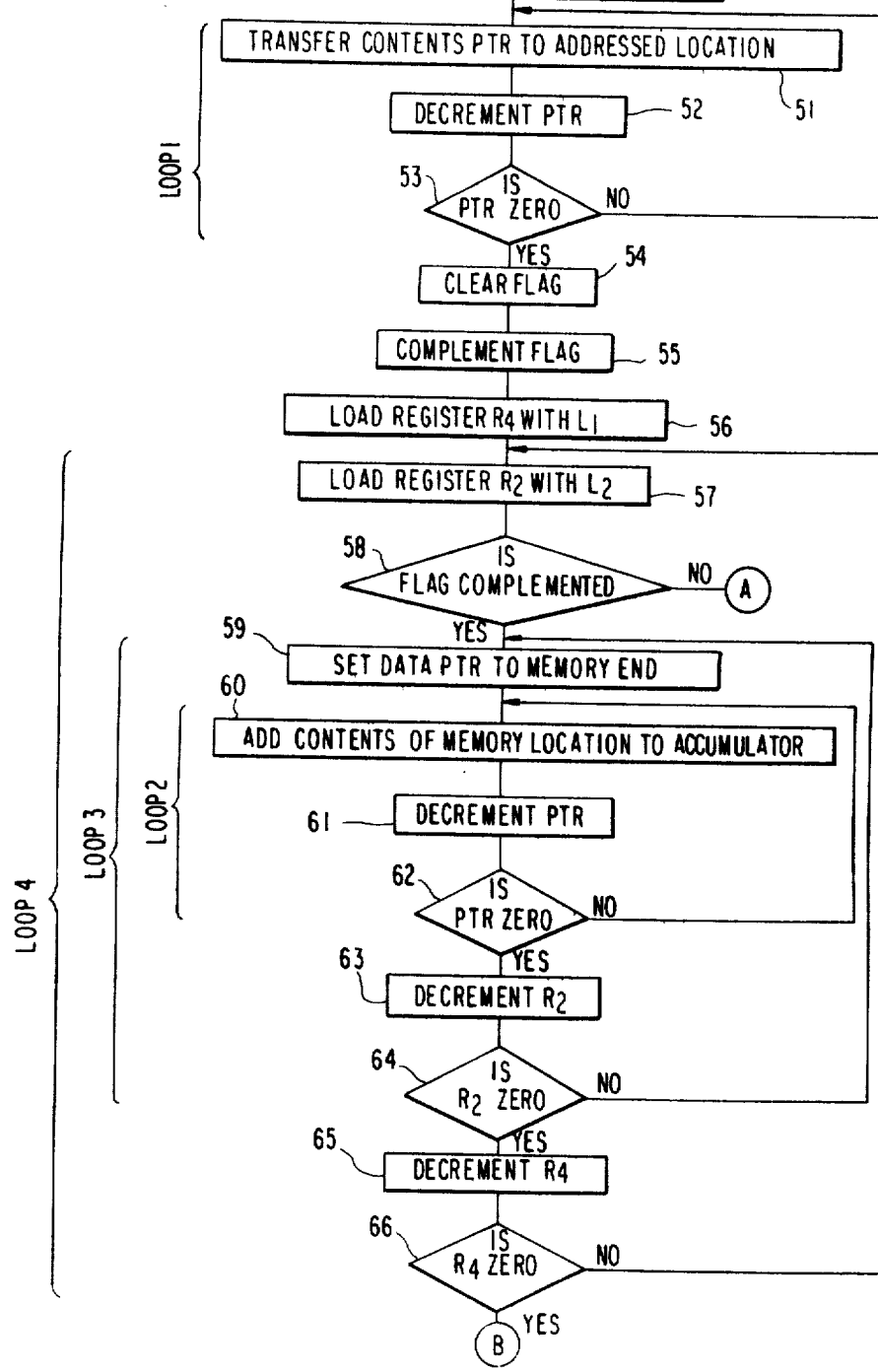

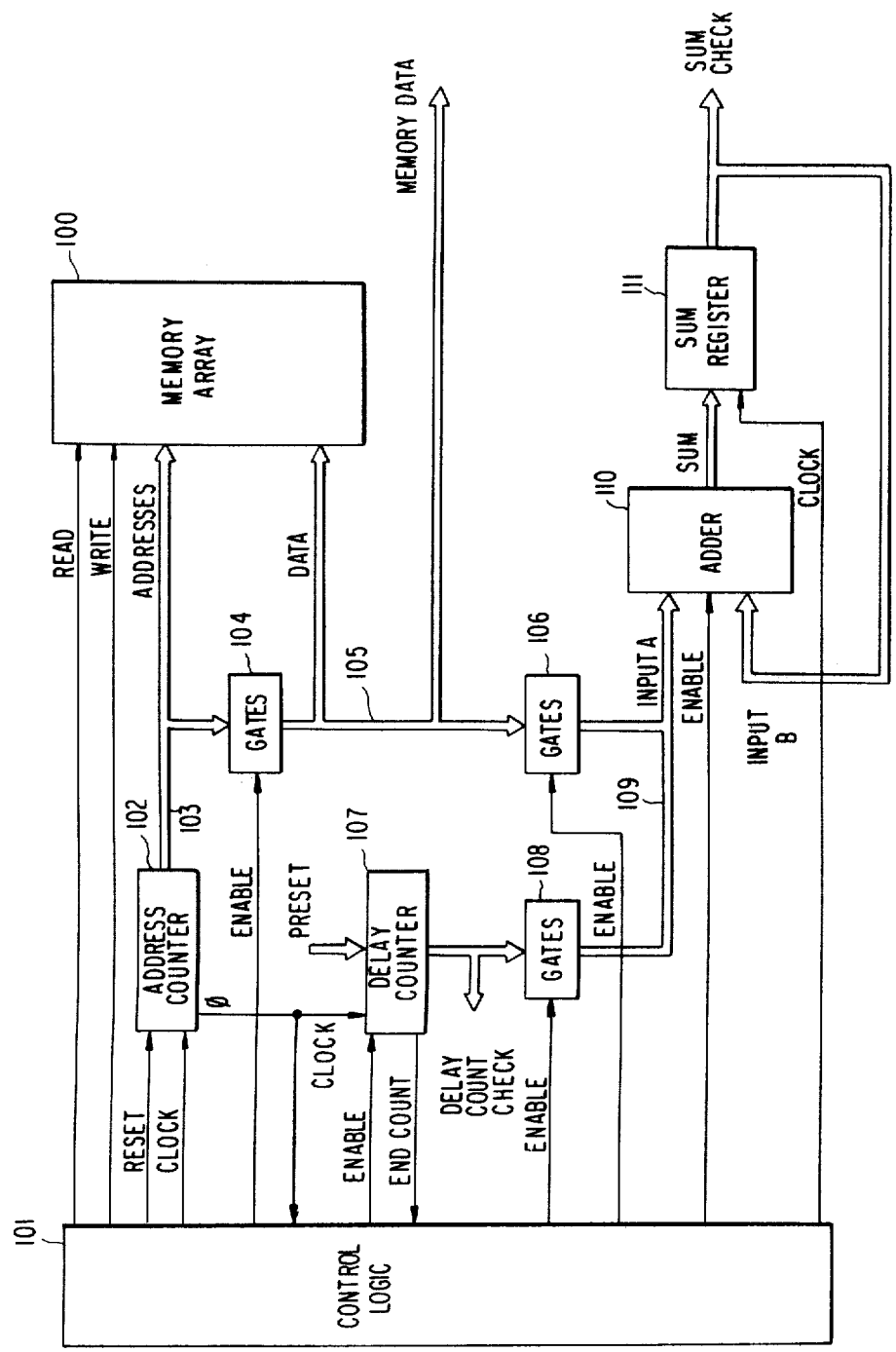
FIG. 7A  VITAL MEMORY TEST AND DELAY

MEMORY MANAGEMENT METHOD AND APPARATUS FOR INITIALIZING AND/OR CLEARING R/W STORAGE AREAS

FIELD OF THE INVENTION

The invention relates to computer memory management techniques and apparatus.

BACKGROUND OF THE INVENTION

A hazard in communications and data processing systems used in transportation controls (or other applications where safety is important) is the inadvertent use of information that is no longer correct. The probability of this hazard coming to pass is relatively high in a computer or processor based system wherein data can be stored in read/write memories. The data management techniques disclosed herein ensure appropriate management of the contents of the data memory so that inappropriate data is destroyed.

Depending on the system, inappropriateness of retaining data can occur at various times. In some systems data is intended to be used once and once only, and thereafter discarded; accordingly, in this context memory must be managed so that once the data is read it is destroyed. In other environments or contexts, the data may be retained for predetermined periods, or periods fixed dependent upon other parameters and in those contexts, data only becomes inappropriate when the specific condition is fulfilled, and accordingly, the appropriate data management techniques ensure the destruction of data only when the condition has been fulfilled.

A typical memory variety is the so-called data stack, which can be conceived of as sequential data arrangement in which data may be extracted from a fixed location only, and to ensure that capability is present, when a piece of data is extracted, each remaining piece of data is moved one memory unit closer to the predetermined location. In this context, data becomes inappropriate for use after it has been extracted and thus, appropriate data management techniques require that in the course of shifting data up and back, memory areas from which data has been extracted are operated with to ensure that extracted data no longer remains.

A further problem which may be present in processor based systems is the necessity to provide for automatic restart capability for power or noise caused failures. The prior art has provided apparatus and techniques to accomplish this function. A problem can develop, however, in the response of associated equipment to such a restart. In the worst case, if the failure is permanent, the processor is cyclically restarted. This can be interpreted by auxiliary equipment as normal functioning if the cycle is short enough and unless positive steps are taken it would be foolish to merely assume the cycle is otherwise long enough to prevent this condition. If the system output governs or contributes to safety then it is essential that repetitive restarts of a processor be recognized as such and not mistaken for normal operation.

SUMMARY OF THE INVENTION

It is therefore, one object of the present invention to provide data management methods and/or apparatus whose use will ensure that, depending upon the particular context, inappropriate data is not retained. Furthermore, it is another object of the present invention to provide data memory management methods and/or apparatus which is arranged to enable a check to be effected to ensure use of appropriate operating procedures and/or apparatus.

In connection with the context which requires data to be destroyed once it is read, one aspect of the invention comprises a method of assuring that a computer memory area has been cleared of preexisting data before further employing said memory area, which memory area is located between initial and final addresses and is addressed by a pointer, the method comprising the steps of:

(a) initially loading said pointer with an address between said initial and final address,
(b) writing a predetermined data word into location addressed by the pointer,
(c) modifying the contents of said addressed memory location in a predetermined fashion,
(d) using the modified contents of the addressed location in a subsequent program step, and
(e) repeating steps (b) to (d) for each other location within the memory area.

In preferred embodiments of the invention, the predetermined data word, written in step (b) is the address of the memory location and step (d) comprises using the modified contents to address another memory location in such a fashion that concatenating a series of sequential steps (b)–(d) addresses each memory location to be processed.

For example, in one specific embodiment of the invention the modification effected to the contents of the addressed memory location (said step c) can comprise merely incrementing those contents. Under those circumstances, the address initially loaded into the pointer is the initial address. On the other hand, the modification effected in said step (c) can comprise decrementing the contents of the addressed memory location, in which event the address initially loaded into the pointer is the final address. In either event, each memory location, beginning either at the initial or final address, is written to ensure that it contains a quantity other than data which may have been stored therein, and this is effected by first writing into that location its own address, and then using that as a basis, modifying the contents of that location so as to reach other locations which have not yet been processed. By appending an appropriate check subsequent to step e, to ensure that an address other than the one at which the pointer was initially loaded with, is reached, one can be assured that each and every location between the initial and final addresses has been cleared of any preexisting data.

In the event that the method described above is employed in connection with data which is to be destroyed when it is read, preexisting data in each memory location is extracted subsequent to step a, but prior to step b. On the other hand, the foregoing method can be employed with data which may be read a number of times, in which event, the method described is only employed when the data becomes inappropriate to retain.

In another aspect of the invention, the data may be organized as a stack and in which a work register is employed in addition to the pointer; in this aspect of the invention the method includes a step of writing the contents of the pointer to the work register prior to executing the step b, and in which the step b comprises: exchanging the contents of the addressed location with the work register, and in which the step d comprises the following six steps:

1. Writing the modified contents of the addressed memory location to the work register,
2. Writing the contents of said work register to said pointer,
3. Exchanging the contents of the addressed memory location and the work register,
4. Modifying the contents of the pointer in another predetermined fashion,
5. Moving the contents of the work register to the addressed memory location, and
6. Modifying the contents of the addressed memory location in said predetermined fashion.

In one specific embodiment of this aspect of the invention the predetermined fashion of steps c and d in which the contents of the memory location are modified comprises incrementing, and the other predetermined fashion of step d, comprises decrementing.

The invention also comprises, an apparatus capable of carrying out the methods described above, The apparatus includes, in addition to an addressable read/write memory array, an address bus on which addresses are supplied for addressing the memory array, and a bidirectional data bus for reading from or writing to addressed locations of the memory array;

an address register coupled to the address bus for placing an address thereon, a transfer register with an output coupled to an input of the address register, and a transfer switch with an output coupled to an input of said transfer register, and two inputs, a first input coupled to the data bus, and a second input coupled to a gate providing a path from the address bus to the transfer switch, the transfer switch selectively enabling one of its two inputs to be coupled to its output, and a gate with an input coupled to its output, and a gate with an input coupled to the data bus and with an output for providing data.

and control means to enable the address register and the two gates as well as the transfer register, for selectively incrementing or decrementing the transfer register and for controlling the transfer switch so as to enable the recited apparatus to carry out the methods recited above.

In accordance with another aspect of the invention, microprocessor based apparatus is provided to simultaneously clear a portion of memory to thereby delete any vital data, check that the foregoing has been successfully accomplished, and further assure that the operation takes at least a mininum amount of time. This particular combination of functions is particularly important when a microprocessor is used to process, and particularly to store data which is vital. Typically, a control system which employs vital data will operate on a closed circuit principle which requires an enabling signal to be present, i.e., either an electrical current flow (in an analog circuit) or data flow (in a digital system). If the processing system fails to operate correctly it must fail safely, that is, it must interrupt the flow (either of electrical current or data). On the other hand, noise and power interruption must be handled in a fashion that allows the processing system to recover and thereafter resume operation. Accordingly, the processing system is desirably arranged to ensure recovery following a transient fault. However, the very recovery procedure should not be allowed to result in an unsafe failure. More particularly, if the fault, be it noise or power interruption is permanent, sequential attempts of the processing system to recover should not provide a flow (of current or data) which makes the output appear to be continuous, i.e., in other words recovery must require a minimum time delay so that any processing system outputs are clearly discontinuous.

This function of providing a vital delay on start-up is combined with the previously described functions of assuring that vital memory is cleared, in accordance with this aspect of the invention. Thus, the vital start delay includes a memory test, but the memory test is arranged so that it consumes a time duration which is sufficient for purposes of preventing any output from appearing continuous. One technique employed in the course of the memory test/time delay is that of iteratively executing a program loop, each iteration of which requires a determinable time quantity. This technique is also exemplified in prior art arrangements such as that shown in my patent, U.S. Pat. No. 4,181,849, entitled Vital Relay Driving Having Controlled Response Time, and in Auer Jr. et al, U.S. Pat. No. 4,168,526 entitled Digital Circuit Generating a Vital Delay.

In accordance with this aspect of the invention a processor, for example, the Intel MCS-48 with registers therein used as data pointers, and loop counters (for counting iterations of the timing loop) are contained in the very memory being cleared and tested. The timing loop is effected by firstly storing in each of the appropriate memory locations, its own address, and thereafter summing the contents of the entire memory, and repeating this operation for a number of iterations determined by the contents of the loop counter. Since, however, the loop counters themselves are part of the memory being tested, and since the contents are continually changing, a successful result must take into account the change in contents of these particular memory locations.

The processing contains a number of features to safeguard against failures that might affect the delay time. The loop counters are tested for zero to prove that they actually have reached the zero condition (at which time the iterations of the loop should be concluded), to insure that the zero condition can be detected, and further that the memory location implementing the loop counter can actually be controlled. Of course, the result of the processing, the sum produced, is also checked.

The production of the sum is checked by a sub-routine which tests the word (representing the sum) which is produced, against a further word (which should be the complement). This is performed by exclusive ORing the two words and comparing the result against a fixed reference. To prove that processing is actually taking place, the word testing sub-routine, increments the word, so that a proper result of the exclusive OR is $-1$ or $FF_{16}$. This result is then incremented by 1 (to 0 or 0000) and compared to 0. In addition, the word testing sub-routine is periodically itself tested by exclusive ORing a test word with $FF_{16}$ (a word of all 1's). The result is then compared with the complement of the test word. Thus, another aspect of the invention provides:

a method of word testing with a word to ensure that desired processing is actually effected by comparing the word with a reference word associated with the word, comprising the steps of:

(a) exclusive ORing said word and said reference word, (b) comparing the result of step (a) with a fixed word, and (c) indicating a successful test if said fixed word is equal to the result of step (a).

BRIEF DESCRIPTION OF THE DRAWINGS

The invention will now be described so as to enable those skilled in the art to practice the same in the following portion of the specification when taken in conjunction with the attached drawings in which like reference characters identify identical subject matter, and in which:

FIGS. 1-3 and 6A-6C are flow charts illustrating processor function comprising different embodiments of the invention;

FIGS. 4, 7A and 7B are block diagrams of other embodiments of the invention.

FIGS. 7A and 7B provide block diagrams of other embodiments to perform the function shown in FIGS. 6A-6C.

DESCRIPTION OF THE INVENTION

Figure 4:
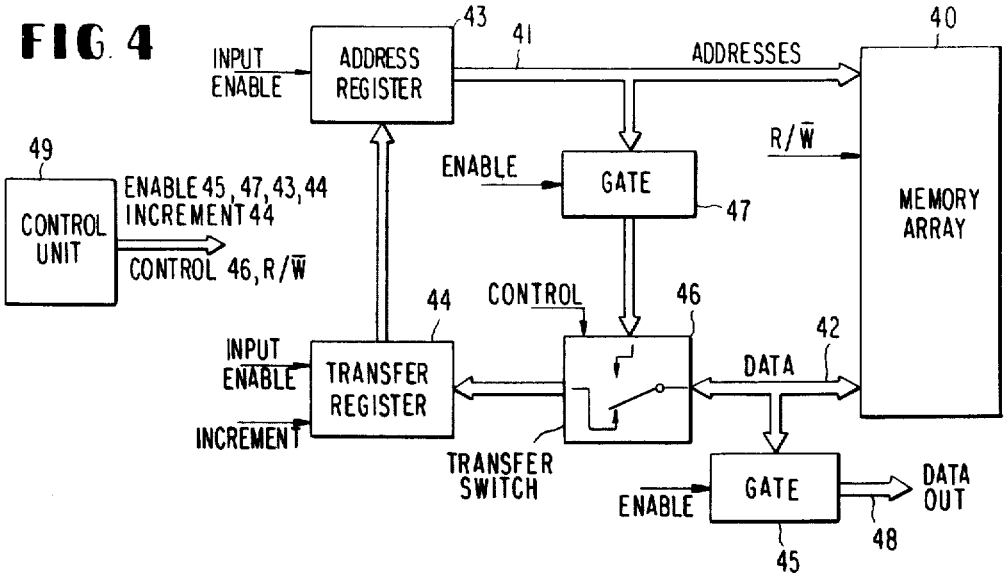

A variety of embodiments of the invention can be implemented on a microprocessor such as the INTEL 8048 family microprocessor. The instruction sequence of one embodiment of the invention is described in FIG. 1, and this requires the use of a hardware pointer, as well as a memory start address, indicating the beginning of the memory area to be read (and purged) as well as the last memory address in this area, and a test word having predetermined characteristics.

As shown in FIG. 1, when it is desired to read the memory in a vital fashion, steps 10 through 13 are initiated; step 10 sets the data pointer to the memory start address. Step 11 moves the contents of the data pointer to the accumulator (ACC).

Step 12 exchanges the contents of the ACC and the memory location addressed by the pointer. At this point, the accumulator holds the data and the memory location has its own address. Accordingly, the memory location has been purged of its data. At this point, the data word in the accumulator can be used as indicated by step 13 shown in dashed outline.

Step 14 increments the contents of the memory location addressed by the pointer and step 15 transfers the contents of the addressed memory location to the pointer.

Steps 14 and 15 cause the data pointer to be incremented to point to the next memory location, but this is effected by using contents of one of the addressed memory locations, ensuring that the next memory location cannot be achieved until the previous memory location has been purged of its data. Step 16 determines whether or not the last memory address has been reached; this is easily effected by using the known last address of the memory area being purged. Assuming that each of the memory addresses to be purged has not been processed, the routine loops back and repeats steps 11 through 15 until each of the memory locations has been used.

When the last memory location is reached, step 17 is effected to move the test word into the accumulator, and step 18 exchanges the contents of the accumulator and the addressed memory location.

This completes the purging; and note that in step 18 a test word has been placed in the last memory location. An independent routine can now (or at a later time) access this location by appropriately setting the pointer, retrieving the test word, which can be independently tested, as a check to prove that the memory area has actually been urged. Unless the memory area has been purged the test word would not be found in the specified location.

While other microprocessors, mini-computers or computers, might have slightly different instruction sets, one of the key features of the invention is the use of the contents of a previously processed memory location to reach unprocessed memory locations. Those of ordinary skill will understand that the incrementing step (step 14) is not essential to the invention, and rather than moving up in memory address space (by using the incrementing step), the method can be practiced by moving down in memory address space (by starting at the last memory address and decrementing rather than incrementing). Other techniques for moving in the memory space will also be apparent, and are compatible with the present invention.

As has been mentioned, in a variant of the invention, it is desired to purge the memory area of its data only at selected times, for example when a predetermined condition is satisfied. Under these circumstances, the routine shown in FIG. 2 is employed, which requires, in addition to the hardware and other parameters required by FIG. 1, a memory test sub-routine. The steps shown in FIG. 2 are entered only when the pre-existing condition has been satisfied such that it is desired to purge a memory area.

As shown in FIG. 2, step 20 sets the data pointer to the memory start address. Step 21 moves the data pointer contents to the accumulator, and step 22 moves the accumulator contents to the addressed memory location. Note that in this routine the data is overwritten, and not extracted since it is assumed that the data has been previously employed. Step 23 increments the memory location addressed by the pointer; step 22 had written the memory location's address into its contents, and thus step 23 uses that data to reach another memory location, as will now be explained.

Step 24 moves a test word to the accumulator and step 25 exchanges the contents of the accumulator and the addressed memory location. At this point, the memory location contains the test word and the accumulator contains the address of the next memory location. Step 26 moves the accumulator contents to the pointer. Step 27 determines whether or not the memory has been completely purged, and if not, the routine loops back to step 21. While step 27 can be implemented in a variety of ways, two will be outlined. A first option is to compare the address of each location being processed with a reference equal to the address of a memory location reached when processing is complete. An equal or greater comparison indicates completion. Another option is to set up a loop counter with a number equal to the number of locations to be processed, and decrement the counter once per location processed. When the counter reaches zero (or below) processing can be terminated. Assuming that it is determined in step 27 that all memory locations have been purged, then a memory test 28 is effected. This memory test is an independent routine to prove that each and every location contains a test word placed there after data has been destroyed. This memory test can use a check sum or signature analysis, and require that appropriate result to allow any further steps to be effected. Note that, as in the first embodiment of the invention the test word written to each memory location, at step 25, may be its own address.

In another context the invention may be operated with a memory stack, i.e., a first in first out type memory. This is illustrated in FIG. 3. Thus, in addition to the memory management techniques effected by the routines of FIGS. 1 and 2, the routine of FIG. 3 must maintain a stack which requires, when a piece of data is to be written, moving the contents of each other memory location to an adjacent location to allow room for the newly written data, and conversely, when a memory location is read out, requires moving the contents of each memory location to an adjacent location to closeup the stack. Since the routine of FIG. 3 is presented in connection with reading out a first in first out memory, the invention is incorporated with memory management techniques to close up the space created by reading out the memory location. Accordingly, function 30 sets a data pointer to the memory start address, function 31 moves the contents of the data pointer to an accumulator and function 32 exchanges the contents of the accumulator and the addressed memory location. As in the case of FIG. 1, the addressed memory location now contains its address, and the accumulator contains its data. Accordingly, function 33 is provided to allow utilization of the contents of the accumulator. Thereafter, function 34 increments the contents of the addressed memory location. At this point, the addressed memory location contains the address of the next memory location. Function 35 transfers the contents of the addressed memory location to the pointer (through the accumulator). Thus, following this step, both the pointer and the accumulator contain the address of the next memory location to be processed, and the memory location last processed contains its own address.

Function 36 exchanges the contents of the accumulator and the memory location addressed by the pointer. At this point, the newly addressed location contains its own address, and the accumulator contains its data. Function 37 now decrements the data pointer, so that it points to the first processed memory location. Function 38 moves the contents of the accumulator (which contains the data of the addressed memory location) to the memory location addressed by the pointer. Following function 38, therefore, the contents of the second addressed memory location is placed in the first addressed memory location. Function 27 determines if processing is completed. If not, function 39 increments the pointer so that it again points to the second addressed memory location; and at this point, the routine loops back to function 34. Thereafter, functions 34 through 39 are repeated for each other memory location transferring the contents to the next adjacent memory location. Function 27 can be implemented with the loop counter approach described in connection with FIG. 2.

In connection with the embodiments of the invention shown in FIGS. 1-3, it should be emphasized that while the steps illustrated employ the accumulator, of course that is not essential to the invention and any available register can be employed instead so long as the processor has appropriate capabilities. Furthermore, it should also be noted that the steps of FIGS. 1-3 employs an instruction such as instruction 34, instruction 23 or instruction 14, to increment the contents of a particular memory location. This is an instruction which is available in the specified INTEL microprocessor family but of course those skilled in the art will understand that another equivalent instruction or instructions could be used to effect the same purpose. In the event the methods of FIGS. 1-3 are implemented on an INTEL 4048 family microprocessor, or other suitable computer, it should be apparent to those skilled in the art that the steps of the methods illustrated in FIGS. 1-3 are stored, in other memory areas, in the form of instructions. These instructions, can be considered firmware, whether in the form of software (i.e., stored in R/W memory) or in hardware (i.e., stored in an ROM).

FIG. 4 is a discrete logic arrangement suitable for effecting the methods shown in FIGS. 1-3, and other methods employing the invention. As shown in FIG. 4 a memory array 40 is controlled by the illustrated apparatus. The memory array 40 can be any conventional read/write memory array which is capable of being addressed and written and/or read. The memory array includes an address input, via address bus 41, an input/output port coupled to a bidirectional data bus 42 and a control R/$\overline{\text{W}}$ input to determine whether or not the memory is to read data at the addressed location and place the data on the data bus, or to write into the addressed memory location the data on data bus 42.

Address bus 41 is controlled by the address register 43, and also provides an input to a gate 47. The output of the gate 47 is coupled to a transfer switch 46, which has another input from the bidirectional data bus 42. The bidirectional data bus also provides an input to a gate 45, which has an output data bus 48. The transfer switch 46 provides an input to a transfer register 44, which provides an output to address register 43. The control unit 49 develops signals to enable registers 45, 44 and gates 45 and 47 to increment the contents of the transfer register 44, to control the transfer switch 46 and the R/$\overline{\text{W}}$ control for memory array 40. Transfer switch 46 may comprise an array of electronic gates, switches or electromechanical switches subject to the control signal from the control unit 49.

Reviewing FIG. 4 in connection with the method of FIG. 1, the address register 43 corresponds to the data pointer used in FIG. 1, and it should be apparent that any address can be set into the address register 43 via the transfer register 44. In order to exchange the contents of an addressed memory location with the data in the data pointer, memory 40 may first be addressed with the transfer switch 46 controlled to couple the data bus to the transfer register, whereafter the data in the addressed memory location may be output via the data bus in gate 45 to the data out bus 48. Subsequently, the memory array 40 is addressed by the same address in the address register 43, but the memory has written therein that address, coupled via the address bus 41, the gate 47 to the transfer switch 46 to the data bus 42.

The memory location contents can be incremented by reading out the memory location via data bus 42 through transfer switch 46 to the transfer register 44; data is incremented in the transfer register 44. Thereafter the incremented contents of the transfer register are coupled to the address register 43, and steps 11-15 can be repeated to write an address in the newly addressed memory location.

Figure 5:
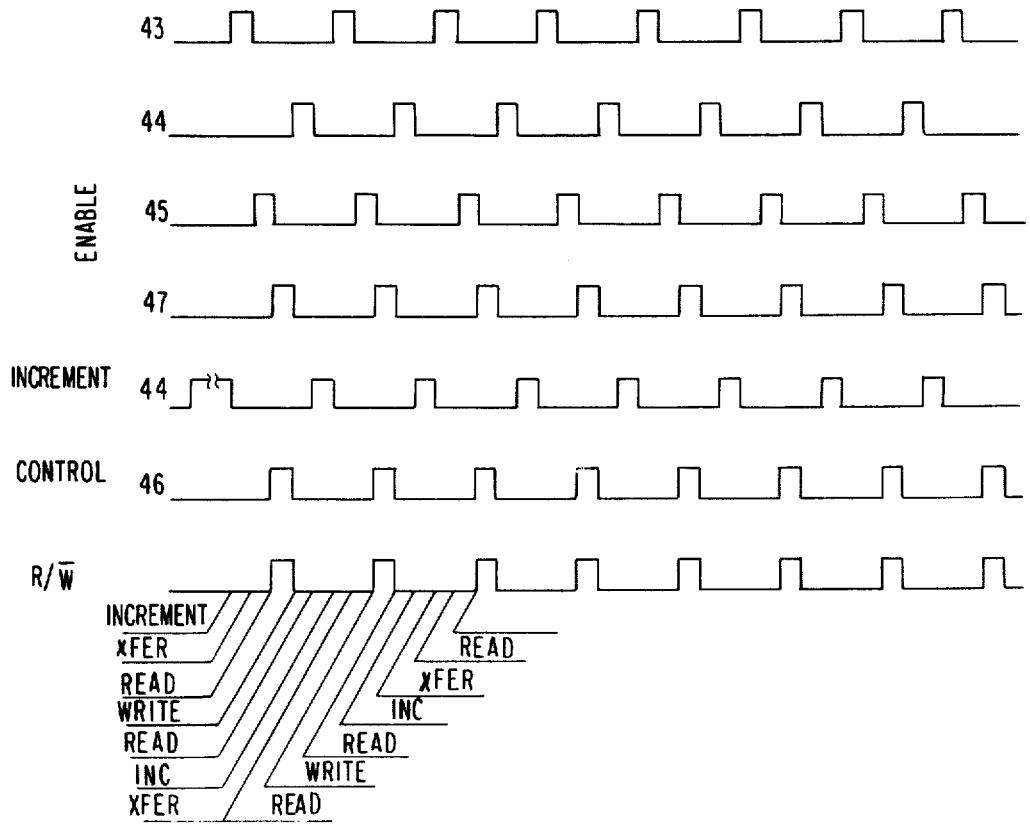
FIG. 5 shows typical operating waveforms for the embodiment of FIG. 4.

FIG. 5 illustrates the waveforms used to enable the gates 45 and 47, registers 43 and 44, the transfer switch and the R/$\overline{\text{W}}$ control lines. The convention used in FIG. 5 is that the presence of a signal enables the associated gate or register, the transfer register 44 is incremented each time the signal 44 is present, the transfer switch 46 normally couples the data bus 42 to the transfer register 44 except in the presence of a signal when it couples the output of gate 47 through the data bus 42, and the memory writes when the R/$\overline{\text{W}}$ signal is high. The cycle of operation, once the address register 43 is initialized comprises four operations, a reading of the addressed memory location and the subsequent writing therein of its own address (corresponding to functions 12 and 13) a reading of the memory location and an incrementing of the transfer register 44, and a transfer to register 43 (corresponding to functions 14 and 15).

In order to implement the functions of steps 17 and 18, a comparator can be provided, coupled to the address bus, to make the comparison contained in step 16, and an additional gate can be provided coupled to the data bus 42 to move the test word to the address location (function 18).

Figure 6B:
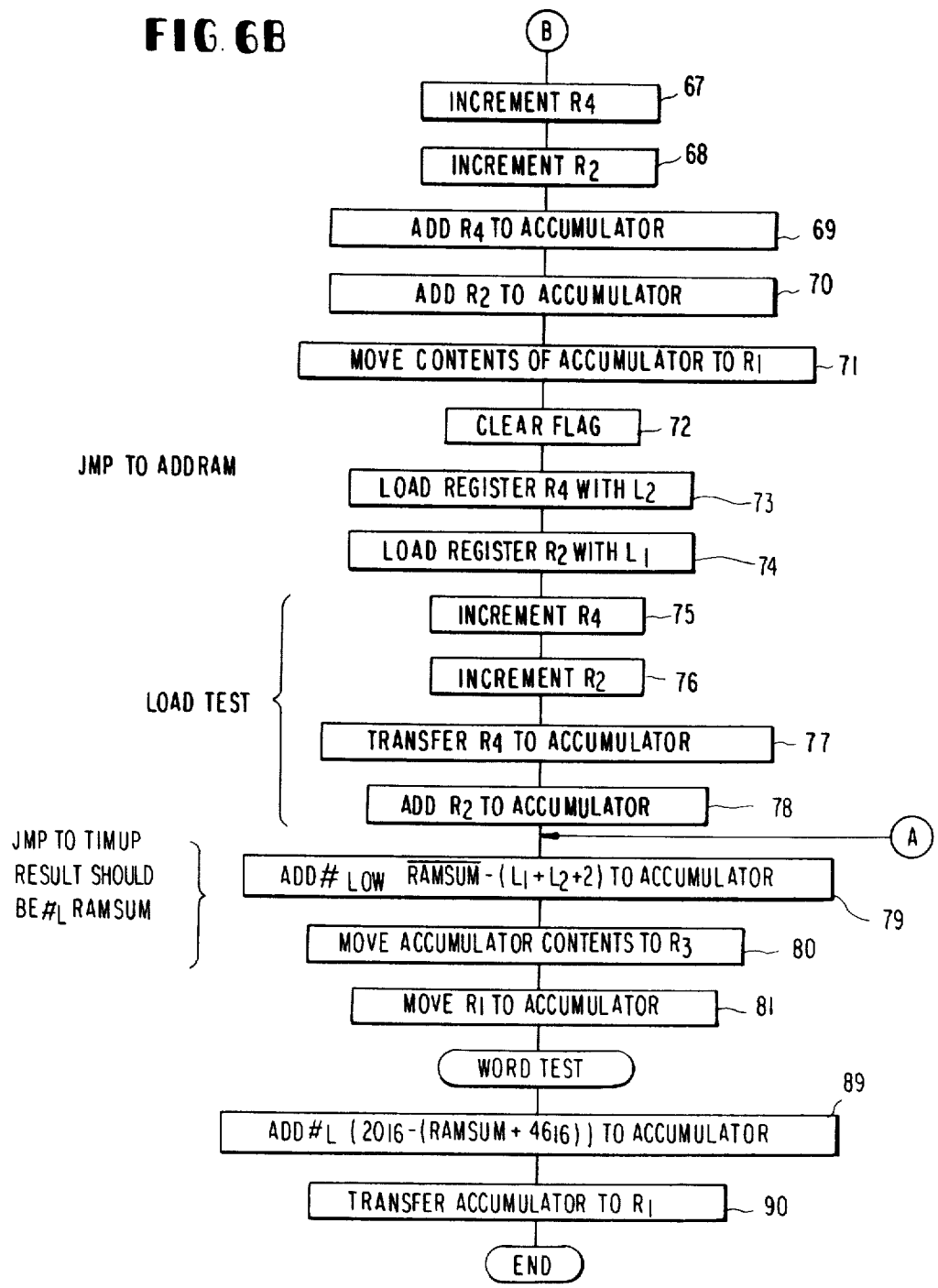
Figure 6C:
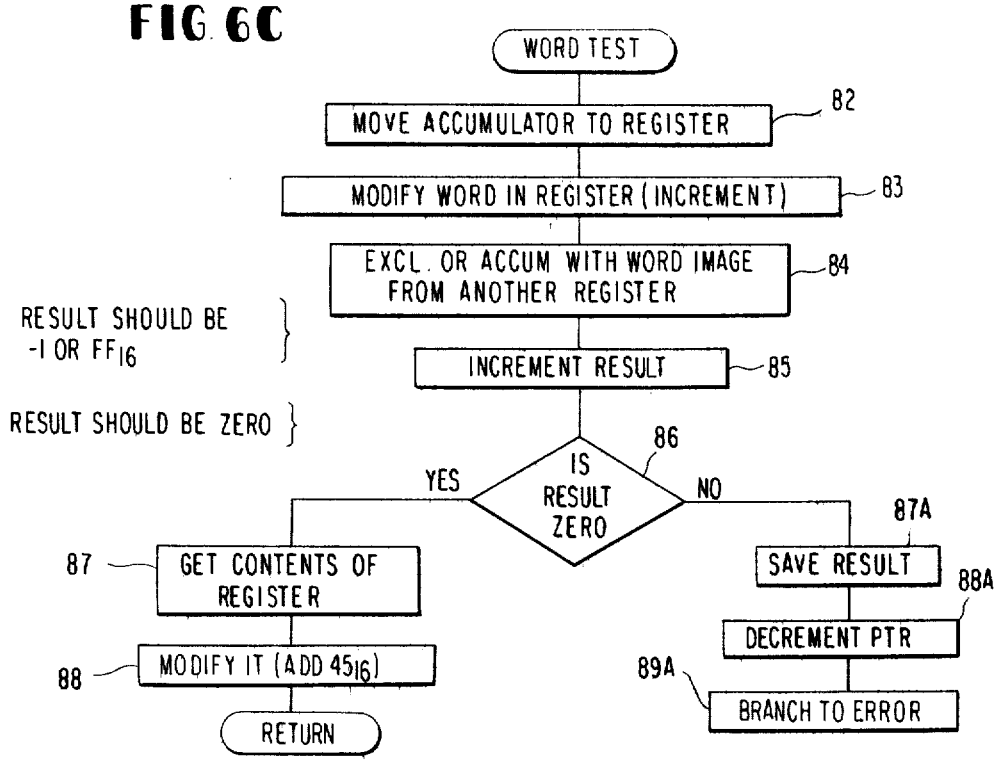

Attached hereto as Appendix A is source statement for the INTEL MCS48 Microprocessor family for effecting the data clearing, data memory test and start delay, and FIGS. 6A through 6C is a corresponding flow diagram. Referring first to FIG. 6A, the parameters used in one embodiment of the invention, related to the specified processor, are noted in the upper lefthand corner of the figure; these parameters were employed for a RAM of 64 ($40_8$) bytes. These parameters are set, in the source statement at lines 44–48 (see Appendix A).

Initially, function 50 sets a data pointer to a location in the RAM memory, in the specific embodiment shown in FIG. 6A, the pointer is set to the memory end, or the memory location with the highest address. Function 51 transfers the contents of the pointer to the addressed location, function 52 decrements the pointer and function 53 determines if the pointer is zero. Since the pointer had begun pointing at the highest addressed location, at the first execution of function 53 the pointer contents are not zero therefore, a loop back is effected to function 51. The loop of functions 51–53 is repeated a sufficient number of times so that the pointer is decremented to zero after the pointer has addressed each of the memory locations and function 51 has written the location's address therein. Note in addition, that function 51 is effected, in the source statement via lines 18–19, whereby the contents of the pointer is first moved to the accumulator, and then the pointer is used to address the addressed location and move the contents of the accumulator therein.

Functions 54 and 55 clear a flag and then complement it. The use of the flag will be made clear hereinafter.

Functions 56 and 57 load registers R4 and R2 with the previously defined quantities L1 and L2, respectively.

Function 58 checks to see if the flag is complemented, and since that function was just accomplished at function 55, the routine continues on to function 59. Function 59 again sets the data pointer as did function 50, and function 60 adds the contents of the addressed memory location to the accumulator. Note that because of function 51 the accumulator has contained the address of the first memory location and thus, the result of function 60 is the sum of the address of the memory location with the highest address, plus 1. Function 61 then decrements the pointer, and function 62 determines if the pointer has been decremented to zero. If the pointer is not zero, the routine loops back and performs function 60 again; this time addressing the next adjacent memory location. The loop of function 60–62 is performed once for each memory location, and when the pointer has been decremented to zero, at function 62 the accumulator is storing a quantity equal to one more than the sum of all the memory location addresses. When the pointer is detected as having been decremented to zero, function 63 is performed to decrement the register R2, and function 64 determines if that register is zero. If it is not, the routine loops back to function 59 and repeats the entire sequence. The sequence is repeated a number of times equal to the quantity stored in R2 (the parameter L2). After that loop has been completed the predetermined number of times, and therefore the contents in the register R2 is zero, function 65 decrements the register R4, and function 66 determines whether or not that register contains the quantity zero. If it does not, the routine loops back to function 57, and the loop of function 57–65 is repeated a number of times equal to the quantity originally stored in register R4. Note that this loop includes reloading the register R2 with a quantity L2 each time the quantity had been decremented to zero.

Referring now to FIG. 6B, function 67 is performed after the above-mentioned loop has been iterated a number of times equal to the quantity originally stored in the register R4. Functions 67 and 68 increment the quantities in the registers R2 and R4, and since these quantities have previously been zero, each now contains the quantity one. Function 69 adds the contents of register R4 to the accumulator, and function 69 adds the contents R2 to the accumulator. Just previous to function 69, the accumulator had stored a quantity corresponding to the repeated summation of the contents of all the memory locations. Note in this regard, that since the registers R2 and R4 are contained within the memory location whose contents are summed, each iteration or summation is effected with a different quantity in the register R2, and likewise for the register R4.

Function 71 then moves the contents of the accumulator (the previously accumulated sum plus the incremented contents of the registers R2 and R4) to a register R1. Function 72 clears the flag, indicating that the summation has been completed, and then functions 73 and 74 again load the registers R4 and R2 with the predefined quantities L2 and L1. Functions 75 and 76 increment these quantities respectively. Functions 77 and 78 thereafter transfer and add the incremented quantities to the accumulator. The results of functions 73–78 is to produce a sum in the accumulator equal to L1+L2+2. Function 79 then adds a predetermined quantity to the accumulator. The predetermined quantity is shown in FIG. 6B to be the difference between low order byte of the complement of RAMSUM defined in line 48 of the source statement (Appendix A) and the sum is L1+L2+2. The result of this addition is to leave, in the accumulator, the complement of the low order byte of RAMSUM. Function 80 thereafter moves the accumulator contents to register R3. Thus at this point in the routine, register R1 stores RAMSUM (as a result of execution of function 71) and register R3 stores the complement (as the result of function 80). Thereafter function 81 moves the contents of R1 to the accumulator and the sub-routine Word Test is entered. Briefly, Word Test (the flow chart of which is shown in FIG. 6C) compares the contents of the registers R3 and R1, and exits with a successful test if they are complementary, as they should be if the program is executed properly. Before further discussing FIG. 6B, reference is now made to FIG. 6C which illustrates the flow chart of Word Test.

As shown in FIG. 6C, function 82 moves the contents of the accumulator to an unused register. When function 82 is performed the accumulator has had stored therein the quantity from register R1, which is RAMSUM. Function 83 thereafter modifies the word in the register involved in the operation of function 82. The specific example shown in FIG. 6C is incrementing the contents of that register.

Function 84 now performs an exclusive OR function between the contents of the accumulator and its complement (obtained from Register R3, loaded at function 80). Accordingly, if the program has executed properly the result of function 84 should be $FF_{16}$. Function 85 thereafter increments this result which should leave the quantity zero in the accumulator. Function 86 tests for this zero, and if the quantity in the accumulator is not zero, functions 87 to 89 are performed, which leads to an error recovery routine, since detection of a nonzero quantity in the accumulator is indicative of some error. On the other hand, if the quantity in the accumulator is zero, then function 87 gets the contents of the register involved in function 83, and function 88 again modifies it. In the specific example shown in FIG. 6C, this modification is effected by adding a fixed quantity thereto ($45_{16}$). The result of the modification at functions 83 and 88 will be taken into account as will be explained hereinafter. When the routine returns, function 89 is executed and it should be noted that function 89 is only executed in the event Word Test, at function 86, is successfully completed. Function 89 adds a quantity to the accumulator (shown in detail in FIG. 6B). Prior to effecting function 89 function 88 leaves in the accumulator the quantity $RAMSUM + 46_{16}$. When function 89 is performed, the result is to leave the quantity $20_{16}$ in the accumulator. And this sum is prepared for use as a check word, when, at function 90 it is transferred to a specified register. Accordingly, the specified register will only contain the specified quantity if, and only if, the data memory is first cleared and tested, and the routines affecting these functions are also tested. It is possible, although extremely unlikely, that some spurious circumstance will cause that very same register to maintain the specific quantity $20_{16}$, however, it should be noted this quantity is not otherwise stored anywhere in any of the fields associated with the functions of FIGS. 6A-6C. Since that probability is vanishingly small, the existence of that quantity in the specified register is taken as an indication that all functions have been successfully executed.

In the specific embodiment of the invention disclosed in connection with the source statement of Appendix A, the delay is approximately 2 seconds for each execution. Accordingly, effecting the functions shown in Appendix A each time the processor is restarted (by reason of a noise interruption, power failure or the like) produces a two second delay in its output. This delay, in many applications is sufficient so that the output will not appear to any other device in the system as being continuous. Of course, in other applications the time of two seconds may be varied, and Appendix A clearly shows the manner in which any appropriate time delay can be effected merely by changing the quantities L1 and L2. At the same time, Appendix A also identifies the effect on the delay time of using larger or smaller RAM's.

Those skilled in the art will, in view of the foregoing description, be capable of making many and varied changes therein all within the spirit and scope of the invention. The embodiments disclosed herein are illustrative, and the scope of the invention is to be determined by the appended claims.

Figure 7B:
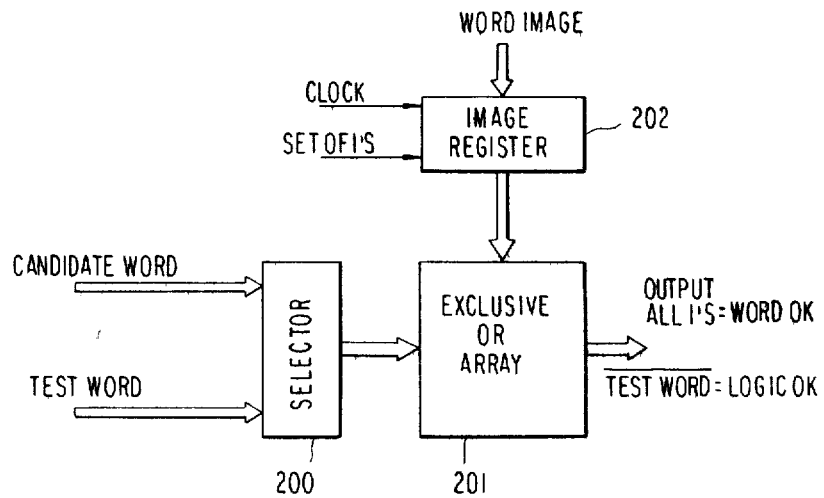

While the preceding description of FIGS. 6A-6C, and Appendix A are provided in the context of the use of random logic, such as found in a microprocessor, it should be understood that that is not at all essential to the invention and, if desired a special purpose machine or discrete logic can be employed to implement the functions of FIGS. 6A-6C. To illustrate this statement, FIGS. 7A and 7B are referred to; FIG. 7A implementing the memory test and delay functions of FIGS. 6A and 6B and FIG. 7B implementing the Word Test logic of FIG. 6C.

Referring first to FIG. 7A, a vital memory test and delay circuit is illustrated to operate on the contents of a memory array 100, which can be any conventional read/write addressable memory array. The vital memory test and delay circuit includes a control logic 101 in order to generate appropriate control and clocking signals as will be more particularly described hereinafter. In addition, a multi-digit address counter 102 is controlled by RESET and CLOCK signals from the control logic 101 and provides a multidigit output to an address bus 103 which is coupled as an input to the memory array 100 and gates 104. The gates 104 are controlled by the ENABLE signal from the control logic 101. The gates 104 are coupled to a bus 105 providing three different parallel signal paths, a data path coupled to the data input of the memory array 100, a memory data path which in effect is an output of the memory 100, and can be coupled and used by auxiliary apparatus, and an input to gate 106 which is also controlled by a further ENABLE signal from the control logic 101.

A zero count output of the address counter 102 is provided as the clocking input to a delay counter 107, which can be preset via its preset input to a predetermined count. The delay counter 107 also responds to an ENABLE input from the control logic 101 and in turn provides an end of count signal to the control logic 101. A multi-digit output of the delay counter 107 is provided through a bus 108 providing two parallel data paths, a first delay count check output, the function of which will be described hereinafter, and the second path which provides an input to gates 108, which are also controlled by an ENABLE signal from the control logic 101. The output of gates 108 and 106 are provided to a bus 109 which provides a first input (input A) to an adder 110, which also responds to an ENABLE input from the control logic 101. The sum register 111 provides an output on a bus 112 which has two parallel paths, a first sum check path, the function of which will be described hereinafter, and a second path which provides the second input (input B) to adder 110.

The apparatus of FIG. 7A is arranged to sum the contents of the memory array 100, after it has been loaded with predetermined data, the summation is used as a check that the array 100 has indeed been so loaded. In preferred embodiments of the invention the predetermined data for each location is the address of the location.

In a first phase of operation the address counter 102 is arranged to point to a first memory location in array 100 with which it is desired to operate. This location is addressed and via gates 104 its address is written therein. Each other memory location, within the range of addresses to be operated on, is similarly written with its own address similar to functions 50-53.

Thereafter the checking operation may commence. Delay counter 107 is preset (similar to function 56 or 57), the address counter 102 is set to a desired address and the apparatus adds the contents (address) of each location via adder 110 to accumulate a sum in register 111 using gates 106. This sum can be increased by the quantity in counter 107, at any time, by enabling gates 108. For example, after a first pass through the array 100, when address counter 102 produces a zero count output to decrement counter 107, the corresponding output to logic 101 is used as the enable signal for gates 108.

The same operation is repeated a number of times equal to the sum initially preset into counter 107 (corresponding to functions 59–64), that is until counter 107 produces an end count signal. If desired, this sequence is repeated a number of times, under control of logic 101, as shown, for example in functions 65,66 and 57. The result of this processing is a quantity in register 111. The output path SUM CHECK allows a comparison of the result produced by the summation to determine if the test was successful. Note that in addition to the memory test, the apparatus of FIG. 7A also delays the production of a successful/unsuccessful signal by the time taken to perform the test, much as in the manner the execution of the function in FIGS. 6A–6C does.

FIG. 7B illustrates apparatus to perform the Word Test shown in flow diagram form in FIG. 6C. This employs a first source for a candidate word, input through the selector 200 to the exclusive OR array 201. The word test operates to compare a candidate word with a separately generated word image. In a typical application the candidate word may be either derived during the course of processing as is shown in FIGS. 6A and 6B, or derived from a table entry. In either case, the word image can be derived from a further table entry, and the test is effected to ensure that the candidate word and word image are complements of each other. To perform the test the word image is located in image register 202. When the test is performed the image register 202 provides the word image to the exclusive OR array 201, and the selector 200 provides the candidate word thereto. The output of the exclusive OR array may be all 1's to indicate that the test was successfully passed. In order to ensure that the test itself is operating correctly, periodically a test word is subject to the test. The test word may be stored at another predetermined location and when a test is desired, selector 200 inputs the test word to the exclusive OR array. Rather than using another storage location to store the word image for the other input to the test, the image register 202 is set to all 1's. When a word is exclusively ORed with another word made up of all 1's the result is the complement of the word. Accordingly, if, during the time that the word testing logic itself is being tested, the exclusive OR array 201 produces the complement of the test word, this indicates successful completion of the test. Of course, the output of the exclusive OR array 201 can be provided to a comparator which is selectively enabled to compare the output with a word made up of all 1's to indicate that the word test was successfully passed in normal operation, or to compare the output of the exclusive OR array to the complement of the test word to indicate that the test of the word testing logic was successfully passed.

APPENDIX A

| LINE | SOURCE STATEMENT |
|---|---|
| 1 TITLE | DATA MEMORY TEST AND START DELAY |
| 4 CLRRAM: | CLEAR AND TEST DATA MEMORY (RAM CONTENTS ARE ADDED L1*L2 TIMES TO PROVIDE SYSTEM START DELAY) |
| | DELAY = APPROXIMATELY L1*L2*3(R−1)*I |
| | L1*L2 = LOOP COUNT |
| | R = RAM SIZE |
| | I = INSTRUCTION EXECUTION TIME |
| | L1 = $26_{16}$, L2 = $38_{16}$, R = $40_{16}$ & I = 0.005 MS GIVES APPROXIMATELY 2 SECONDS |
| 13 | JMP LOOP 1; BYPASS INTRPT LOC'S |
| 15 | ORG $10_{16}$ |
| 17 | MOV R0, #$3F_{16}$; POINT TO TOP OF RAM |
| 18 LOOP 1: | MOV A,R0; MOVE CONTENTS OF R0 TO LOCATION POINTED TO BY R0 |
| 19 | MOV a R0,A |
| 20 | DJNZ R0, LOOP 1 |
| 21 | CLR F1 |
| 22 | CPL F1 |
| 23 | MOV R4,#L2; LOAD LOOP COUNTERS |
| ADDRAM: | |
| 24 LOOP 4 | MOV R2,#L1 |
| 25 | JF1 Loop 3; SKIP LOAD TEST |
| 26 LODTST: | INC R4 |
| 27 | INC R2 |
| 28 | MOV A,R4 |
| 29 | ADD A,R2 |
| 30 | JMP TIMUP; LOAD AGAIN |
| 31 LOOP 3: | MOV R0,#RAMSIZ-1 |
| 32 LOOP 2: | ADD A, a R0; SUM CONTENTS OF RAM |
| 33 | DJNZ R0, LOOP 2 |
| 34 | DJNZ R2, LOOP 3; REPEAT TO DELAY START |
| 35 | DJNZ R4, LOOP 4 |
| 36 | INC R4 ; TEST LOOP COUNTERS FOR ZERO |
| 37 | INC R2 |
| 38 | ADD A,R4 |
| 39 | ADD A,R2 |
| 40 | MOV R1,A; SAVE SUM |
| 41 | CLR F1 ; TEST LOOP COUNTERS |
| 42 | JMP ADDRSM |

-continued

APPENDIX A

| LINE | | SOURCE STATEMENT |
|---|---|---|
| 44 RAMSIZ | EQU | $40_{16}$; INTEL 8048 RAM |
| 45 L1 | EQU | $26_{16}$; L1+L2 MUST BE AN EVEN NUMBER |
| 46 L2 | EQU | $38_{16}$ |
| 47 SO | EQU | $3F_{16}*20_{16}-(2+4)$; LOOP CTRS = R2&R4 |
| 48 RAMSUM | EQU | L1*L2*(S0+(L1+L2)/2+1)+1+2 |
| 50 TIMUP; | ADD | A,#LOW (NOT RAMSUM)-(L1+L2+2) |
| 51 | MOV | R3,A; LOAD TEST IMAGE |
| 52 | MOV | A,R1; GET SUM |
| 53 | CALL | WRDTST: TEST CHECK WORD |
| 54 | ADD | A,#LOW ($20_{16}$-(RAMSUM+$46_{16}$) |
| 55 | MOV | R1,A; INIT CHK WORD PTR |
| 57 WRDTST | | |
| 59 END | | |

What is claimed is:

1. A method of assuring that a computer memory area is cleared of pre-existing data before employing said memory area, which memory area is located between initial and final addresses, and is addressed by a pointer, comprising the sequential steps of:
   (a) initially loading said pointer with an address to a location between said initial and final addresses, thereby defining an addressed location,
   (b) writing the address of said addressed location into said addressed location so that said addressed location contains its own address,
   (c) modifying the contents of said addressed memory location in a predetermined fashion so that the modified contents of said addressed memory location can be used to address a different location in said memory area,
   (d) using the modified contents of the addressed location in a subsequent program step,
   (e) and repeating said steps (b)–(d) for each other location within said memory area.

2. The method of claim 1 wherein said step (d) comprises transmitting the modified contents to said pointer.

3. The method of claim 2 wherein said step (c) comprises incrementing said contents, and said step (a) comprises loading said pointer with said initial address.

4. The method of claim 2 wherein said step (c) comprises decrementing said contents, and said step (a) comprises loading said pointer with said final address.

5. The method of claim 2 in which preexisting data is extracted comprising an additional step, after step (a), but before step (b), of reading said addressed location.

6. The method of claim 1 which includes a further step, subsequent to step e, of testing the contents of said memory area to ensure that said memory area contains predetermined contents, loaded therein in repeated iterations of steps (b) and (c).

7. The method of claim 2 in which the memory area is a stack memory and includes a work register, and which includes a further step of:
   (a-1) writing the contents of said pointer to said work register so that, after said writing, said work register contains data identical to the contents of said pointer, prior to said step (b),
   and in which said step (b) comprises
   (b-i) exchanging contents of the addressed location and work register, and said step (d) comprises;
   (d-i) writing the modified contents of said addressed memory location to said work register, and
   (d-ii) writing the contents of said work register to said pointer, and includes the further steps of,
   (d-iii) exchanging the contents of said addressed memory location and said work register,
   (d-iv) modifying the contents of said pointer in another predetermined fashion,
   (d-v) moving the contents of the work register to the addressed memory location, and
   (d-vi) modifying the contents of the addressed memory location in said predetermined fashion.

8. The method of claim 7 in which said predetermined fashion of steps (c) and (d-vi) comprises incrementing, and said another predetermined fashion of step (d-iv) comprises decrementing.

9. A digital computer in which messages are decoded and/or stored as data in specified R/W storage areas, apparatus to prevent inappropriate use of such data comprising:
   R/W memory means for storage of data including said R/W storage area, said R/W storage area including plural memory locations capable of containing digital information,
   pointer register means to address said R/W memory means with information contained in said pointer register means,
   means to ensure that following a reading of said R/W storage area, pre-existing data stored therein prior to said reading will no longer be available, including:
   first means for setting said pointer register means to address a memory location within said R/W storage area,
   second means for transferring the contents of said pointer register means to said addressed memory location,
   third means for incrementing the contents of said addressed memory location,
   fourth means for transferring the contents of said addressed location to said pointer register means, and
   means for repeatedly operating said first through said fourth means a number of times sufficient to access each memory location in said R/W storage area.

10. An initialization method of ensuring that computer operations begin without existence of preexisting data in a RAM comprising the steps of:
   (a) addressing each location in said RAM and writing a predetermined quantity therein so that each such location contains said predetermined quantity,
   (b) loading at least one register with a predetermined quantity,
   (c) summing the contents of each of said locations a number of times equal to said determined quantity to produce a first result, and decrementing said at least one register once each time the contents of each of said locations is summed, (d) verifying operability of said at least one register and producing a predetermined second result as a result of such verification including
   i. reloading said at least one register with said predetermined quantity,
   ii. modifying said determined quantity in a predetermined fashion, to produce a third result and
   iii. summing said third result with a predetermined quantity selected based on expected values of said third result and said first result to produce said second result, (e) comparing said first and second results, and (f) storing, as an indication of successful completion of steps (a)-(e) the result of said comparison.

11. The method of claim 10 in which said at least one register is included with said RAM and as a result of said step (c) a sum of all said memory locations is different from each iteration of said summation.

12. The method of claim 10 in which said step (b) comprises loading said at least one register and a further register, one with said determined quantity and the further register with a further determined quantity, and said step (c) comprises repeating said summing a determined number of times, and decrementing said further register once each time said at least one register is decremented to zero.

13. The method of claim 10 in which said step (b) comprises loading said at least one register and a further register, one with said determined quantity, and the further register with an additional determined quantity, and said step (c) comprises repeating said summing a determined number of times, itself, a further determined number of times, and decrementing said further register once each time said at least one register is decremented to zero, and in which both said registers are included in said RAM.

* * * * *